(12) United States Patent
Nashida (10) Patent No.: US 9,129,840 B2
(45) Date of Patent: Sep. 8, 2015

(54) SEMICONDUCTOR DEVICE AND METHOD FOR MANUFACTURING SAME

(71) Applicant: FUJI ELECTRIC CO., LTD., Kawasaki-shi (JP)

(72) Inventor: Norihiro Nashida, Nagano (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/470,076

(22) Filed: Aug. 27, 2014

(65) Prior Publication Data

US 2014/0361445 A1  Dec. 11, 2014

Related U.S. Application Data

(63) Continuation of application No. PCT/JP2013/053391, filed on Feb. 13, 2013.

(30) Foreign Application Priority Data

Mar. 15, 2012 (JP) ................................ 2012-058727

(51) Int. Cl.
*H01L 23/00* (2006.01)
*H05K 3/32* (2006.01)
(Continued)

(52) U.S. Cl.
CPC ............ *H01L 24/09* (2013.01); *H01L 23/3735* (2013.01); *H01L 23/4334* (2013.01); *H01L 23/49811* (2013.01); *H01L 23/49833* (2013.01); *H01L 24/01* (2013.01); *H01L 24/13* (2013.01); *H01L 24/16* (2013.01); *H01L 24/81* (2013.01); *H01L 25/072* (2013.01); *H05K 3/32* (2013.01); *H05K 3/4015* (2013.01); *H01L 24/05* (2013.01); *H01L 24/11* (2013.01); *H01L 24/29* (2013.01); *H01L 24/32* (2013.01); *H01L 2224/0401* (2013.01); *H01L 2224/05639* (2013.01); *H01L 2224/05644* (2013.01); *H01L 2224/05647* (2013.01); *H01L 2224/05655* (2013.01); *H01L 2224/11848* (2013.01); *H01L 2224/13017* (2013.01); *H01L 2224/13019* (2013.01); *H01L 2224/13147* (2013.01); *H01L 2224/13294* (2013.01); *H01L 2224/13339* (2013.01);
(Continued)

(58) Field of Classification Search
CPC ......................................................... H01L 24/09
See application file for complete search history.

(56) References Cited

U.S. PATENT DOCUMENTS

| 5,545,589 | A | 8/1996 | Tomura et al. |
| 6,107,109 | A * | 8/2000 | Akram et al. ............ 438/15 |

(Continued)

FOREIGN PATENT DOCUMENTS

| JP | 06283537 A | 10/1994 |
| JP | 07106491 A | 4/1995 |

(Continued)

OTHER PUBLICATIONS

International Search Report issued in PCT/JP2013/053391, dated Apr. 9, 2013.

*Primary Examiner* — William Coleman
(74) *Attorney, Agent, or Firm* — Rossi, Kimms & McDowell LLP (57) ABSTRACT

When a conductive post is bonded to a bonding target member such as a semiconductor chip or an insulating substrate with conductive patterns by using metal nanoparticles, a strong bonding layer can be obtained by forming a bottom surface of the distal end of the conductive post in a concave shape.

18 Claims, 8 Drawing Sheets

(51) Int. Cl.
- *H05K 3/40* (2006.01)
- *H01L 23/373* (2006.01)
- *H01L 23/433* (2006.01)
- *H01L 23/498* (2006.01)
- *H01L 25/07* (2006.01)
- *H05K 3/34* (2006.01)

(52) U.S. Cl.
CPC ............ *H01L2224/13347* (2013.01); *H01L 2224/13369* (2013.01); *H01L 2224/13639* (2013.01); *H01L 2224/13644* (2013.01); *H01L 2224/13655* (2013.01); *H01L 2224/1623* (2013.01); *H01L 2224/16225* (2013.01); *H01L 2224/16227* (2013.01); *H01L 2224/16238* (2013.01); *H01L 2224/16501* (2013.01); *H01L 2224/16505* (2013.01); *H01L 2224/291* (2013.01); *H01L 2224/32225* (2013.01); *H01L 2224/73253* (2013.01); *H01L 2224/81048* (2013.01); *H01L 2224/81065* (2013.01); *H01L 2224/8184* (2013.01); *H01L 2224/81091* (2013.01); *H01L 2224/81095* (2013.01); *H01L 2224/81192* (2013.01); *H01L 2224/81193* (2013.01); *H01L 2224/81203* (2013.01); *H01L 2224/81359* (2013.01); *H01L 2224/81385* (2013.01); *H01L 2224/92242* (2013.01); *H01L 2924/01029* (2013.01); *H01L 2924/01047* (2013.01); *H01L 2924/01078* (2013.01); *H01L 2924/10272* (2013.01); *H01L 2924/1203* (2013.01); *H01L 2924/12032* (2013.01); *H01L 2924/1304* (2013.01); *H01L 2924/1306* (2013.01); *H01L 2924/13091* (2013.01); *H01L 2924/20105* (2013.01); *H01L 2924/20106* (2013.01); *H01L 2924/20107* (2013.01); *H01L 2924/20108* (2013.01); *H01L 2924/35* (2013.01); *H05K 3/3436* (2013.01)

(56) References Cited

U.S. PATENT DOCUMENTS

| | | | | |
|---|---|---|---|---|
| 6,555,764 | B1 * | 4/2003 | Maruyama et al. | 174/267 |
| 7,118,389 | B2 * | 10/2006 | Fork et al. | 439/74 |
| 7,628,629 | B2 * | 12/2009 | Miyazaki et al. | 439/248 |
| 8,318,596 | B2 * | 11/2012 | Kuo et al. | 438/613 |
| 2011/0121448 | A1 | 5/2011 | Tsukada et al. | |
| 2011/0254152 | A1 * | 10/2011 | Lin | 257/737 |
| 2012/0186863 | A1 * | 7/2012 | Inoue et al. | 174/257 |
| 2012/0199988 | A1 * | 8/2012 | Meura et al. | 257/777 |

FOREIGN PATENT DOCUMENTS

| | | |
|---|---|---|
| JP | 2006269682 A | 10/2006 |
| JP | 2006352080 A | 12/2006 |
| JP | 2009064852 A | 3/2009 |
| JP | 2011114040 A | 6/2011 |
| WO | 2013136896 A1 | 9/2013 |

\* cited by examiner

SEMICONDUCTOR DEVICE AND METHOD FOR MANUFACTURING SAME

CROSS-REFERENCE TO RELATED APPLICATIONS

This application is a continuation of International Application No. PCT/JP2013/053391, filed on Feb. 13, 2013, and is based on and claims priority to Japanese Patent Application No. JP 2012-058727, filed on Mar. 15, 2012. The disclosure of the Japanese priority application and the PCT application in their entirety, including the drawings, claims, and the specification thereof, are incorporated herein by reference.

BACKGROUND

1. Field of the Invention

Embodiments of the present invention relate to a semiconductor device having a semiconductor chip mounted thereon and conductive posts and a method for manufacturing the same, and more particularly, to a semiconductor device in which conductive posts are bonded by metal particle bonding using metal nanoparticles and a method for manufacturing the same.

2. Discussion of the Background

Figure 6A:
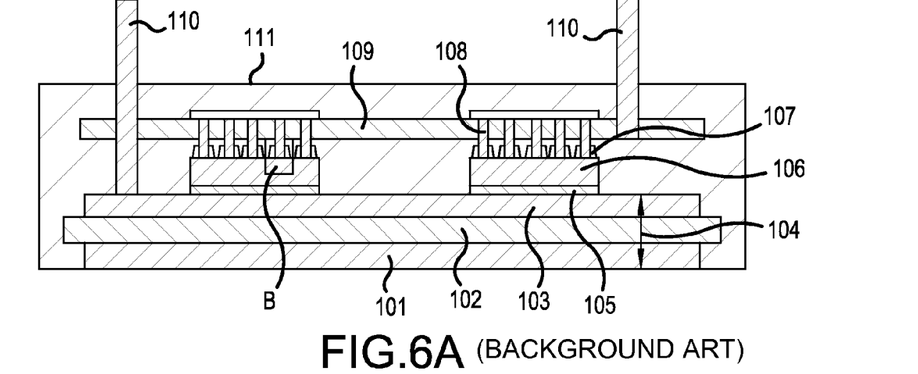
FIG. 6A is a general cross-sectional view of a main part and FIG. 6B is an enlarged view of a portion indicated by B in FIG. 6A.
Figure 6B:
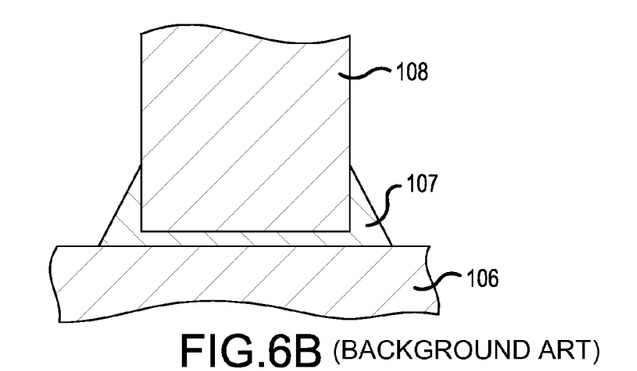

FIGS. 6A and 6B are diagrams illustrating a configuration of a conventional semiconductor device disclosed in Japanese Patent Application Publication No. 2009-64852 ("Patent Document 1"), in which FIG. 6A is a general cross-sectional view of a main part and FIG. 6B is an enlarged view of a portion indicated by B in FIG. 6A. A semiconductor power module which is a conventional semiconductor device has a structure in which a semiconductor chip 106 is bonded to a direct copper bonding (DCB) substrate 104 which is an insulating substrate with conductive patterns by a bonding material 105 such as a solder, and electric wires on the surface of the semiconductor chip 106 are bonded to a printed circuit board 109 having conductive posts 108 by a bonding material 107 such as a solder. In this structure, the semiconductor chip 106 and the DCB substrate 104 are sealed by a sealing resin 111 to form the semiconductor power module. The DCB substrate 104 includes a heat sink 101, an insulating substrate 102, and a circuit pattern 103.

Figure 7:
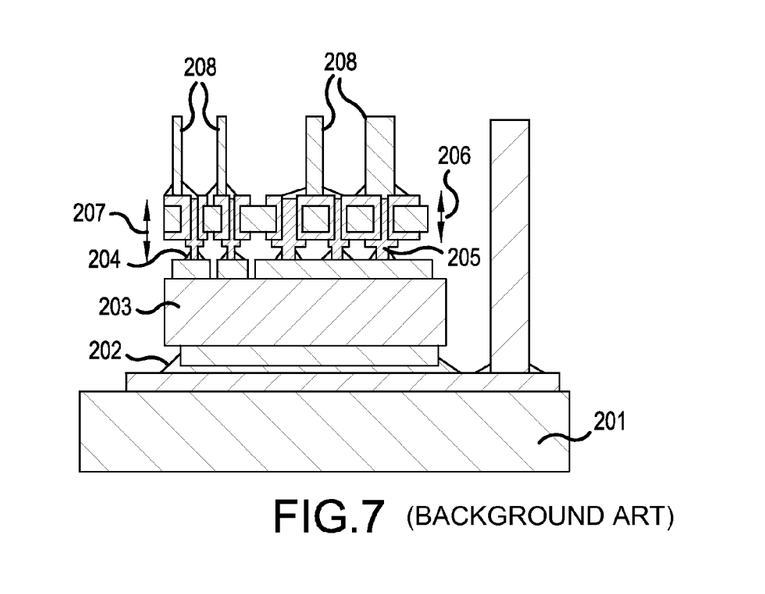
FIG. 7 is a cross-sectional view of a main part of another conventional semiconductor device disclosed in Patent Document 2.

FIG. 7 is a cross-sectional view of a main part of another conventional semiconductor device disclosed in Japanese Patent Application Publication No. 2011-114040 ("Patent Document 2"). A semiconductor power module which is another conventional semiconductor device is a resin-sealed semiconductor power module similarly to FIGS. 6A and 6B. Patent Document 2 discloses a supporting plate 206 corresponding to the printed circuit board 109 of FIGS. 6A and 6B and conductive posts 205 connected thereto and a method for manufacturing the same. In the drawing, reference numeral 201 is a heat sink, reference numeral 202 is a conductive material, reference numeral 203 is a semiconductor chip, reference numeral 204 is a conductive material, reference numeral 207 is a connection substrate, and reference numeral 208 is an external leadout terminal.

Moreover, Japanese Patent Application Publication No. H7-106491 ("Patent Document 3") indicates that at least a distal end portion or an entire portion of a conductive post which is a plurality of pins is formed in a hollow pipe shape, and a solder fillet is formed on outer and inner surfaces of the conductive post, whereby a bonding area of a solder bonding portion is increased and a bonding strength can be improved. Moreover, it is also indicated that a solder paste or a solder is attached in advance to the distal end portion of the hollow pipe-shaped conductive post and mounting is performed, whereby soldering defects can be prevented. Moreover, it is also indicated that a spherical or semi-spherical portion is formed in the distal end of the conductive post, whereby the surface area of the distal end portion of the conductive post is increased, a solder bonding area is increased, and a decrease in the reliability of the solder bonding portion can be prevented.

In the semiconductor power module which is the semiconductor device of Patent Document 1, the semiconductor chip 106 and the DCB substrate 104 are bonded, and electrodes on the surface of the chip 106 are collectively connected by the conductive posts 108 instead of aluminum wires to form wirings. In this way, a current path of the DCB substrate 104, the semiconductor chip 106, and the printed circuit board 109 is formed. When a solder is used as a bonding material 107, solders are disposed in the bonding portions of the upper and lower electrodes of the chip 106 and are heated and cooled, whereby bonding is completed.

However, when a wide band gap (WBG) semiconductor device such as a silicon carbide (SiC) device or a gallium nitride (GaN) device is mounted, the semiconductor power module needs to operate in high temperatures in order to take advantage of the merits thereof. When the operating temperature reaches 200° C. or higher, the use of solder is difficult from the perspective of reliability.

Moreover, a silicon carbide (SiC) device such as a SiC-MOSFET (MOS-type field effect transistor) or a SiC-SBD (Schottky barrier diode) has a small chip size (for example, approximately 3 mm by 3 mm). Due to this, a gate pad of a SiC-MOSFET is very small, and the size thereof is approximately 200 μm by 200 for example. It is difficult to fix conductive posts to such a small gate pad with high accuracy.

According to the conductive posts of the semiconductor devices disclosed in Patent Documents 1 to 3 and the bonding method thereof, it is difficult to solve these problems.

SUMMARY

Embodiments of the present invention provide a semiconductor device capable of tightly bonding conductive posts to a bonding target member such as a semiconductor chip or an insulating substrate with conductive patterns by using metal nanoparticles, and a method for manufacturing the same.

According to an aspect of the present invention, there is provided a semiconductor device including a semiconductor chip and a conductive connector, in which a concave portion is formed in a bottom surface of a distal end of the conductive connector fixed to a bonding target material, and the conductive connector is bonded to the bonding target material in the concave portion using metal nanoparticles.

Moreover, the conductive connector may be a conductive post or an external leadout terminal fixed to a printed circuit board.

Moreover, a distal end of the conductive post may have a shape selected from a tapered shape, a step shape, and a combination of the step shape and the tapered shape.

Moreover, a concave portion on a bottom surface of a distal end of the conductive post may have a shape that is curved in a spherical shape. Moreover, the bonding target material may be a surface electrode of the semiconductor chip or a conductive pattern of an insulating substrate with conductive patterns to which the semiconductor chip is fixed.

Moreover, a depth of the concave portion on the bottom surface of the distal end of the conductive connector may be between 10μm and 200 μm.

According to another aspect of the present invention, there is provided a semiconductor device including at least: a conductive connector having a concave portion formed in a distal end thereof; and a bonding target material, wherein the conductive connector and the bonding target material are bonded by a sintered metal particle portion which is densely filled in the concave portion.

Moreover, the conductive connector may be a rod-shaped conductive post having the concave portion formed in one end thereof, and the bonding target material may be a surface electrode of a semiconductor chip.

Moreover, the conductive connector may be a rod-shaped external leadout terminal having the concave portion formed in one end thereof, and the bonding target material may be a conductive pattern of an insulating substrate with conductive patterns.

According to another aspect of the present invention, there is provided a method for manufacturing a semiconductor device, including: an application step of applying a paste containing metal nanoparticles onto a bonding target material; a placing step of preparing a conductive connector having a concave portion in a distal end thereof and placing the conductive connector so that the concave portion is positioned on the paste; and a sintering step of heating the metal nanoparticles and applying pressure to the metal nanoparticles with the conductive connector to sinter the metal nanoparticles and bond the bonding target material and the concave portion.

Moreover, in the sintering step, a heating temperature may be between 150° C. and 300° C., and the pressure may be between 10 MPa and 50 MPa.

Moreover, the method may further include, prior to the sintering step, a prebaking step of heating a solvent contained in the paste to evaporate the solvent.

According to embodiments of the present invention, metal nanoparticles are filled in the concave portion formed in the distal end of the conductive connector, and the conductive connector and the bonding target material are bonded by metal particle bonding using metal nanoparticles, whereby the conductive connector and the bonding target material can be tightly bonded together.

BRIEF DESCRIPTION OF THE DRAWINGS

FIGS. 1A, 1B, and 1C are diagrams illustrating a configuration of a semiconductor device according to Example 1 of the present invention, in which

FIGS. 2A, 2B, and 2C illustrate the steps of bonding a conductive post 8 and a upper electrode 6a of a semiconductor chip 6, in which FIGS. 2A to 2C are cross-sectional views illustrating mains steps in order.

FIGS. 3A and 3B are cross-sectional views of a main part illustrating the shape of a concave portion of a bottom surface 12 of a distal end according to a modification of the conductive post 8 of FIGS. 1A to 1C, the shape being different from that of the concave portion in FIGS. 1A to 1C, in which

FIGS. 4A and 4B are diagrams illustrating a configuration of a semiconductor device according to Example 2 of the present invention, in which

FIGS. 5A and 5B are diagrams illustrating the shape of a distal end portion according to a modification of the conductive post 21, in which

FIGS. 6A and 6B are diagrams illustrating a configuration of a conventional semiconductor device disclosed in Patent Document 1, in which

FIGS. 8A, 8B, and 8C are model diagrams for describing the mechanism of metal particle bonding, in which FIGS. 8A to 8C are diagrams illustrating the steps for realizing metal particle bonding in order.

DESCRIPTION OF ILLUSTRATED EMBODIMENTS

Embodiments of the present invention will be described based on the following examples.

Example 1

Figure 1A:
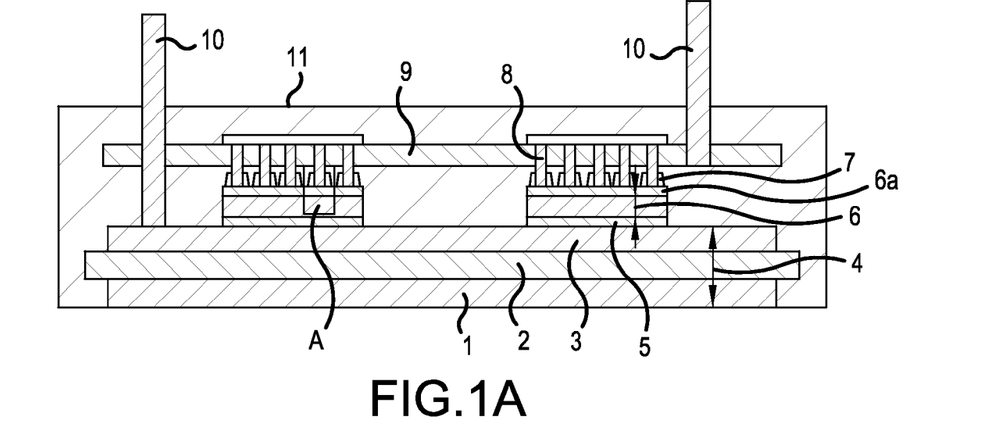
FIG. 1A is a general cross-sectional view of a main part.
Figure 1B:
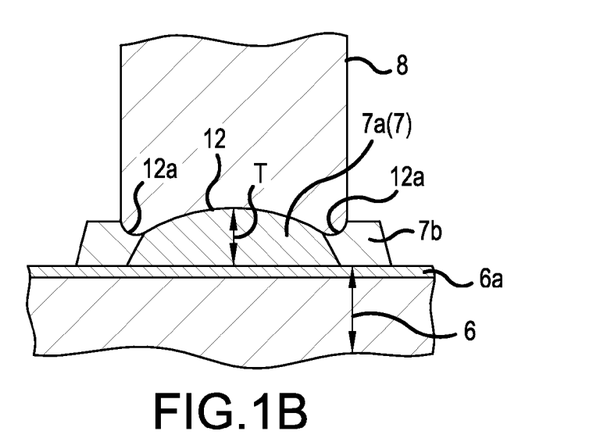
FIG. 1B is an enlarged view of a portion indicated by A in FIG. 1A.
Figure 1C:
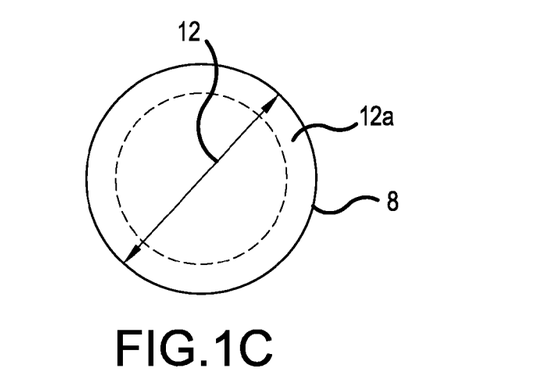
FIG. 1C is a plan view of a bottom surface of a distal end of a conductive post in FIG. 1B.

FIGS. 1A to 1C are diagrams illustrating a configuration of a semiconductor device according to Example 1 of the present invention, in which FIG. 1A is a general cross-sectional view of a main part, FIG. 1B is an enlarged view of a portion indicated by A in FIG. 1A, and FIG. 1C is a plan view of a bottom surface of a distal end of a conductive post in FIG. 1B. FIGS. 1A to 1C are diagrams corresponding to the semiconductor device of FIGS. 6A and 6B.

In FIG. 1A, a DCB substrate 4 which is an insulating substrate with conductive patterns includes a heat sink 1, an insulating substrate 2, and a circuit pattern 3. A semiconductor chip 6 is fixed onto the circuit pattern 3 of the DCB substrate 4 by a bonding material 5. Conductive posts 8 are fixed onto an upper electrode 6a of the semiconductor chip 6 with a bonding layer 7. The conductive posts 8 are fixed to a printed circuit board 9. External leadout terminals 10 are fixed to the circuit pattern 3 and the printed circuit board 9. The bottom surface of the heat sink 1 and the external leadout terminals 10 are exposed and the entire substrate is sealed by a sealing resin 11. At least the bonding layer 7 among the bonding material 5 and the bonding layer 7 is formed using metal nanoparticles.

In FIG. 1B, a concave portion is formed in a bottom surface 12 of a distal end of the conductive post 8. A sintered metal particle portion 7a is present between the upper electrode 6a of the semiconductor chip 6 and the bottom surface of the distal end of the conductive post 8, and a non-sintered metal particle portion 7b is present around the sintered metal particle portion 7a. The concave portion of the bottom surface 12 has a bow shape (spherical shape), a ball shape, or a smooth dome-shaped curved surface.

In FIG. 1C, the bottom surface 12 of the distal end of the conductive post 8 has a circular planar shape in order to perform pressing uniformly. An outer circumferential portion 12a of the bottom surface 12 is chamfered in order to avoid concentration of stress, and has a smooth curved surface. Moreover, the cross-sectional shape of the conductive post 8 is not limited to a circular shape but may be a polygonal shape such as a tetragonal shape or a hexagonal shape.

The conductive post 8 and the upper electrode 6a of the semiconductor chip 6, which is a bonding target member, are bonded by a strong bonding layer 7, which is formed from the sintered metal particle portion 7a formed by sintering metal nanoparticles (for example, silver nanoparticles or copper nanoparticles). The bonding layer 7 is obtained by heating, pressing, and sintering metal nanoparticles, and this bonding method is referred to as metal particle bonding.

The circuit pattern 3 of the DCB substrate 4 or a circuit pattern (not illustrated) of the printed circuit board 9 may be used as a bonding target member, and bonding between the circuit pattern 3 and the external leadout terminal 10 and bonding between the circuit pattern (not illustrated) of the printed circuit board 9 and the external leadout terminal 10 may be realized using metal nanoparticles. In these cases, the bottom surface of the distal end of the external leadout terminal 10 may be formed in a concave shape, as described herein with reference to the conductive post 8.

Figure 2A:
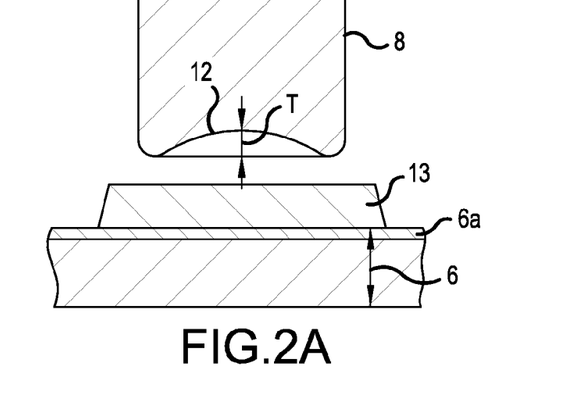
Figure 2B:
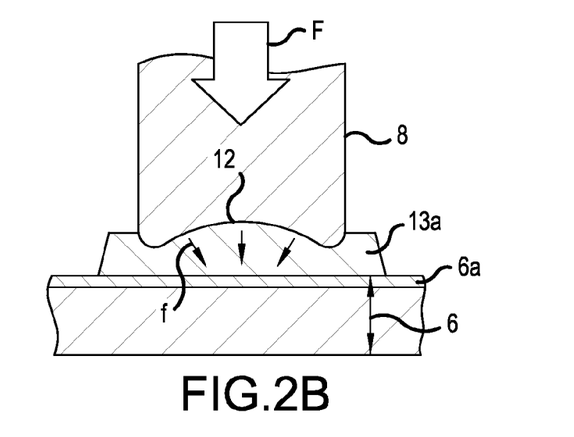
Figure 2C:
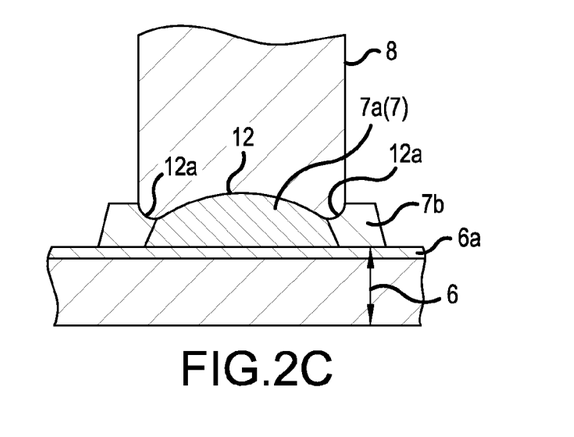

FIGS. 2A to 2C illustrate the steps of bonding the conductive post 8 and the upper electrode 6a of the semiconductor chip 6, in which FIGS. 2A to 2C are cross-sectional views illustrating main steps in order.

A metal nanoparticle paste 13 in which metal nanoparticles are dispersed and mixed is applied to the upper electrode 6a of the semiconductor chip 6 according to a screen printing method, for example (FIG. 2A).

Metal nanoparticles may be formed from at least one metal selected from copper, silver, platinum, and the like, and the diameter thereof may be between 1 nanometer (nm) and several hundred nanometers. Metal nanoparticles of other materials may be mixed and used. The metal nanoparticle paste 13 is a material in which metal nanoparticles, an organic dispersing agent added so that fine metal particles do not aggregate during storage and manufacturing steps, and a dispersion auxiliary material that reacts with the organic dispersing agent during bonding to remove the organic dispersing agent are mixed with an organic binder (solvent) to form a paste. The thickness of the applied metal nanoparticle paste 13 may be between 100 μm and 500 μm.

Moreover, the surface of the upper electrode 6a may be plated with copper, gold, silver, nickel, or the like. Subsequently, the conductive post 8 of which the bottom surface 12 has a concave shape is placed so that the distal end thereof is positioned on the applied metal nanoparticle paste 13. The conductive post 8 is a member obtained by molding copper or a copper alloy or one obtained by plating the member with gold, silver, nickel, or the like.

After that, as a prebaking step, the paste 13 is heated to evaporate a solvent to form an aggregated metal nanoparticle layer 13a (FIG. 2B). Further, pressure is applied to the metal nanoparticle layer 13a by the concave portion of the conductive post 8 and the metal nanoparticle layer 13a is heated, whereby the metal nanoparticles are sintered and the sintered metal particle portion 7a is formed as a strong bonding layer 7 (FIG. 2C).

The concave portion on the bottom surface 12 of the distal end of the conductive post 8 is curved in a spherical shape, and the depth T thereof may be between 10 and 200 μm. For example, the thickness T may be approximately 100 μm. If the depth T is smaller than 10 μm a large amount of metal nanoparticles are pushed out and the strong bonding layer 7 is not formed. On the other hand, if the depth T is larger than 200 μm, metal nanoparticles are not sufficiently filled into the concave portion, pressing force is not satisfactorily transferred to the metal nanoparticles. As a result, the strong bonding layer 7 is not formed.

Moreover, although the heating temperature during the prebaking step is different depending on the solvent contained in the paste 13, the temperature may be between 100° C. and 150° C., for example. The sintering temperature of the metal nanoparticles may be between 150° C. and 300° C., for example, is approximately 200° C. This is because, if the sintering temperature is lower than 150° C., the temperature is so low that metal nanoparticles do not become a bulk (a sintered layer). Moreover, if the sintering temperature exceeds 300° C., the solvent evaporates too quickly, metal nanoparticles aggregate quickly, and thus, the strong bonding layer 7 that bonds the conductive post 8 and the upper electrode 6a of the semiconductor chip 6 which is a bonding target material is not formed.

Moreover, the pressing force F applied to the metal nanoparticle layer 13a may be between 10 MPa and 50 MPa, for example, approximately 30 MPa. This is because the pressing force F of 10 MPa is so low that a sintered layer is not formed. Moreover, if the pressing force exceeds 50 MPa, the force is so high that defects such as cracks are introduced to the bonding target material due to the stress of the end portion of the conductive post 8.

Moreover, in order to suppress oxidation of the bonding target material (in case of copper, in particular), the prebaking step may be performed in a nitrogen atmosphere. In order to remove air remaining in the concave portion when the metal nanoparticle layer 13a makes contact with the bottom surface of the distal end of the conductive post 8, the sintering may be performed in a decompressed atmosphere. As illustrated in FIG. 2B, since the metal nanoparticle layer 13a is formed so as to be densely filled in the concave portion formed on the bottom surface 12 of the distal end of the conductive post 8, the pressing force F applied from the conductive post 8 to the metal nanoparticles is applied in a downward direction indicated by arrow F illustrated in the drawing so as to converge in the central axis direction of the conductive post 8. Due to this, metal nanoparticles are suppressed from flowing toward the outside from the bottom surface 12 of the conductive post 8. Moreover, the metal nanoparticle layer 13a is pressed by the concave portion, whereby the pressing force required for sintering is not dispersed and is effectively transferred to the metal nanoparticles. As a result, sintering progresses reliably and the sintered metal particle portion 7a can be formed as the strong bonding layer 7.

As illustrated in FIG. 2C, the metal nanoparticle layer 13a to which the pressing force F is not applied becomes a non-sintered metal particle portion 7b and does not contribute to bonding. Due to this, a fillet like solder bonding is not formed. However, the sintering of the sintered metal particle portion 7a is strong, and thus, the conductive post 8 and the upper electrode 6a are fixed by the strong bonding layer 7.

Since the planar shape of the bottom surface of the conductive post 8 is a circular shape, the pressing force F is uniformly transferred to the metal nanoparticles. Moreover, since the outer circumferential portion 12a of the bottom surface 12 of the conductive post 8 is chamfered and smooth, concentration of stress on this portion is prevented. As a result, it is possible to prevent concentration of stress during bonding and to prevent concentration of stress during operation of devices after bonding.

The bonding method described above can also be applied to bonding between the external leadout terminal 10 and the circuit pattern 3 by using the external leadout terminal 10 having the concave portion formed on the bottom surface of the distal end thereof. The external leadout terminal 10 and the circuit pattern 3 are formed from copper or a copper alloy, for example, and base materials thereof may be plated with nickel or the like.

A WBG semiconductor device like a SiC device allows miniaturization and high-temperature operations, and metal particle bonding is optimal bonding means.

Figure 3A:
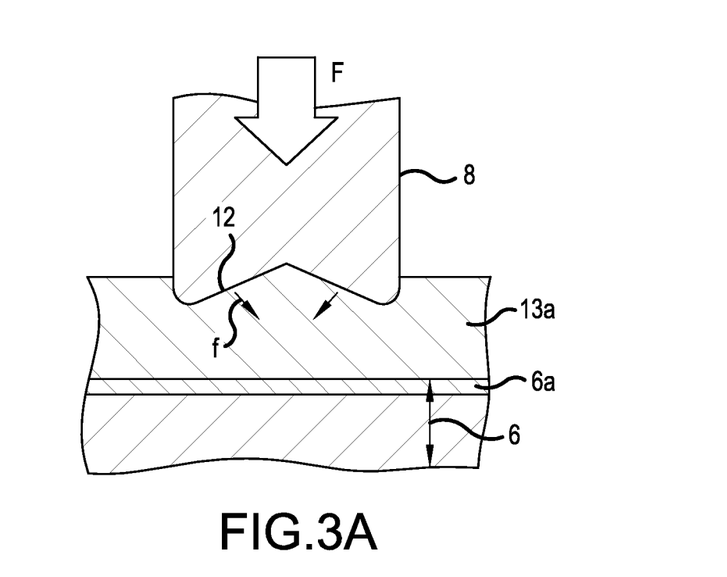
FIG. 3A is a view when the shape of the concave portion is formed by four planes and FIG. 3B is a view when the shape of the concave portion is formed by a number of planes.
Figure 3B:
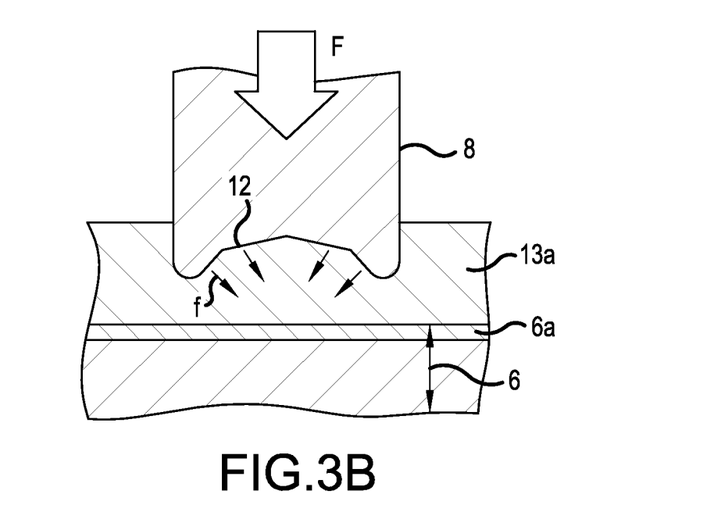

FIGS. 3A and 3B are cross-sectional views of a main part illustrating the shape of the concave portion of the bottom surface 12 of the distal end according to a modification of the conductive post 8 of FIGS. 1A to 1C, the shape being different from that of the concave portion in FIGS. 1A to 1C, in which FIG. 3A is a view when the shape of the concave portion is formed by four planes and FIG. 3B is a view when the shape of the concave portion is formed by a number of planes. For example, the concave portion of FIG. 3A has a pyramidal shape, and the concave portion of FIG. 3B has a combination of two different pyramidal shapes. In any case, since the bottom surface 12 has a concave shape, the pressing force F is effectively transferred from the conductive post 8 to the metal nanoparticles in the metal nanoparticle layer 13a, and a strong bonding layer is obtained.

Example 2

Figure 4A:
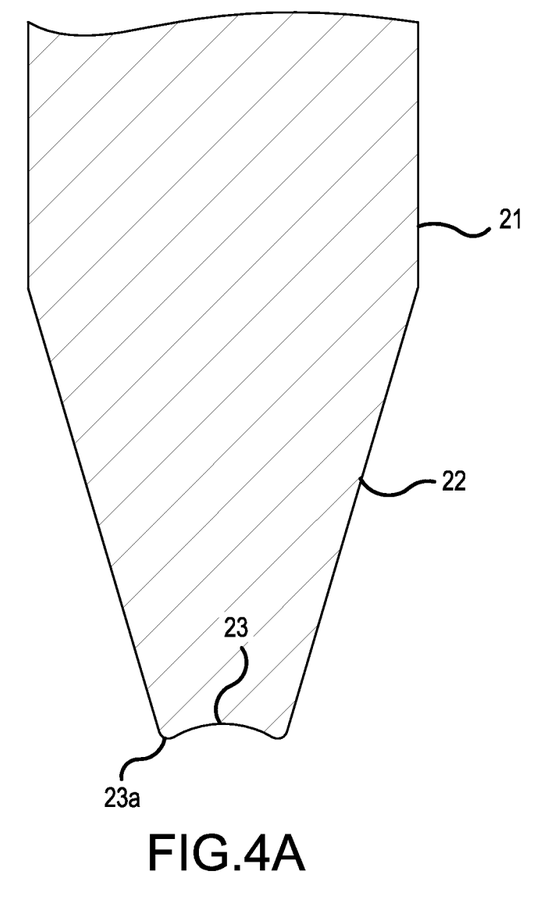
FIG. 4A is a cross-sectional view of a main part of a conductive post 21 and FIG. 4B is a plan view of a bottom surface 23 of a distal end of the conductive post 21.
Figure 4B:
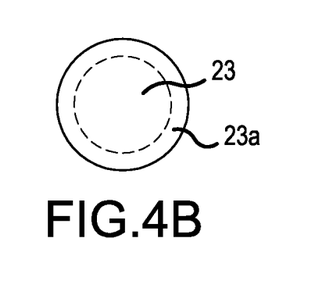

FIGS. 4A and 4B are diagrams illustrating a configuration of a semiconductor device according to Example 2 of the present invention, in which FIG. 4A is a cross-sectional view of a main part of a conductive post 21 and FIG. 4B is a plan view of a bottom surface 23 of a distal end of the conductive post 21. The general cross-sectional view of the main part of the semiconductor device according to Example 2 is the same as the general cross-sectional view (FIG. 1A) of the main part of the semiconductor device according to Example 1 except for the following differences. Thus, redundant description thereof will not be provided. A distal end portion 22 of the conductive post 21 of the semiconductor device of this example is different from that of the conductive post 8 illustrated in FIGS. 1B and 1C. The conductive post 21 has a tapered shape such that the diameter of the distal end portion 22 decreases as the conductive post 21 advances toward a bottom surface 23 having the concave portion formed therein. In the conductive post 21, it is possible to decrease the area of the bottom surface 23 of the conductive post 21 as compared to the conductive post 8 having an approximately circular columnar outer shape and having the same diameter up to the distal end. The diameter of the distal end of the distal end portion 22 may be approximately 100 μm, for example. The conductive post 21 can be bonded to the upper electrode 6a (in particular, for example, a gate pad, or the like) of the small semiconductor chip 6 such as a WBG semiconductor device. When a concave portion is formed on the bottom surface 23 of the distal end of the conductive post 21 similarly to FIGS. 1A to 1C, a sintered metal particle portion can be formed in the concave portion as a strong bonding layer 7, and the bottom surface 23 having a small area can be reliably bonded to the upper electrode 6a.

Figure 5A:
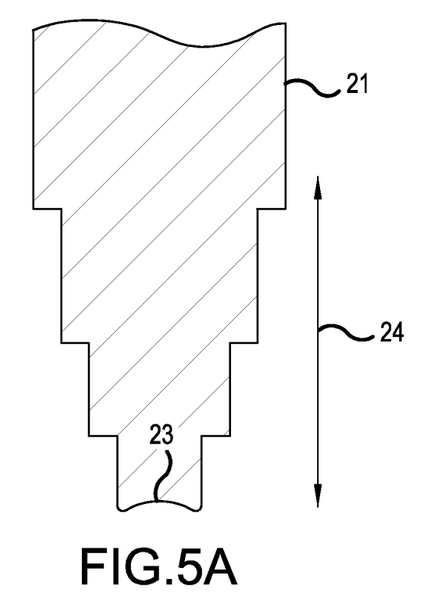
FIG. 5A is a view when the distal end narrows in a stepwise manner and FIG. 5B is a view when the distal end has a combination of a step shape and a tapered shape.
Figure 5B:
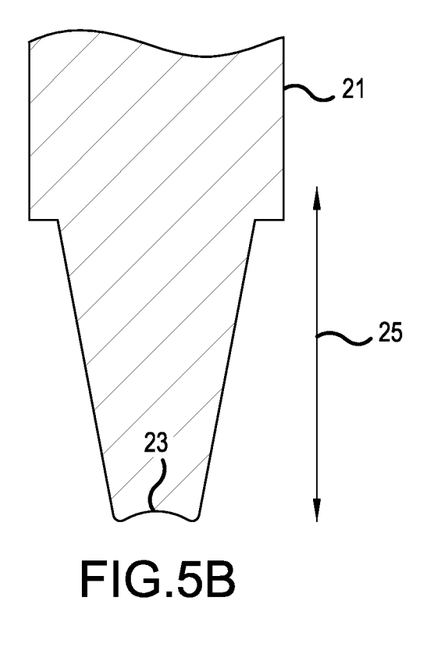

FIGS. 5A and 5B are diagrams illustrating the shape of a distal end portion according to a modification of the conductive post 21, in which FIG. 5A is a view when the distal end 24 narrows in a stepwise manner and FIG. 5B is a view when the distal end 25 has a combination of a step shape and a tapered shape. The planar shape of the bottom surface 23 of the distal end of the conductive post 21 is the same as that of FIG. 4B. In the figures, although the cross-sectional shape of the shaft of the conductive post 21 is a circular shape, the cross-sectional shape may be a polygonal shape such as a tetragonal shape or a hexagonal shape.

REFERENCE EXAMPLE

An example in which, in the conventional semiconductor device illustrated in FIGS. 6A and 6B, the semiconductor chip 106 and the DCB substrate 104 or the conductive post 108 are bonded (this is referred to as metal particle bonding) using metal nanoparticles such as silver (Ag) nanoparticles as the bonding materials 105 and 107 will be described.

The bonding materials 105 and 107 which are in a paste form are applied to a bonding portion and are then subject to a step of heating and evaporating a solvent or the like (this is a prebaking step). In this state, the metal nanoparticles remain solid. After that, the metal nanoparticles which are bonding members are heated and pressed to be sintered in order to obtain sufficient bonding strength, whereby bonding is realized.

Figure 8A:
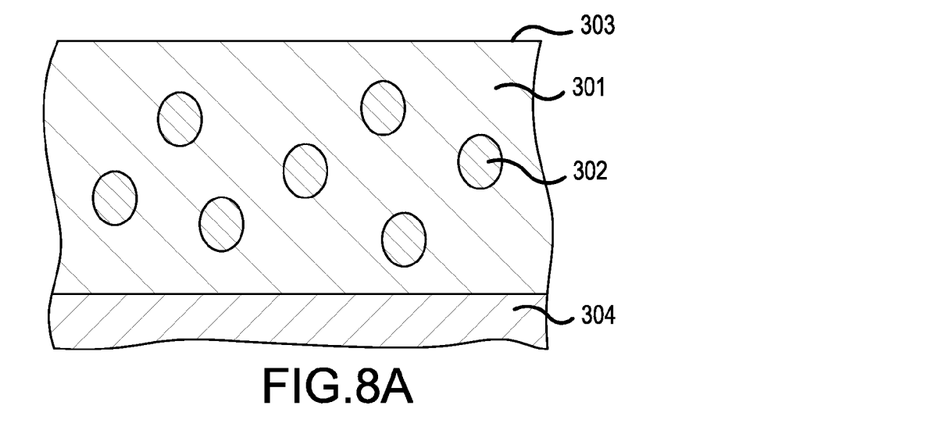
Figure 8B:
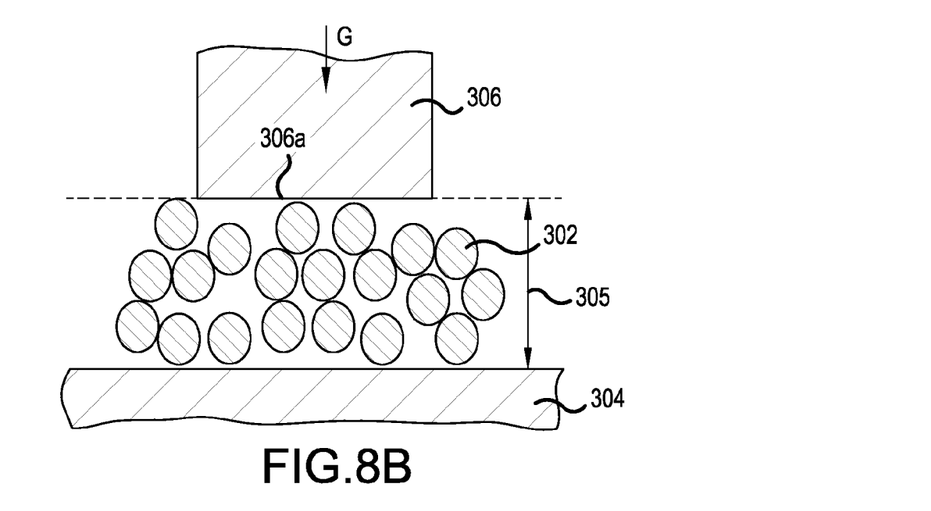
Figure 8C:
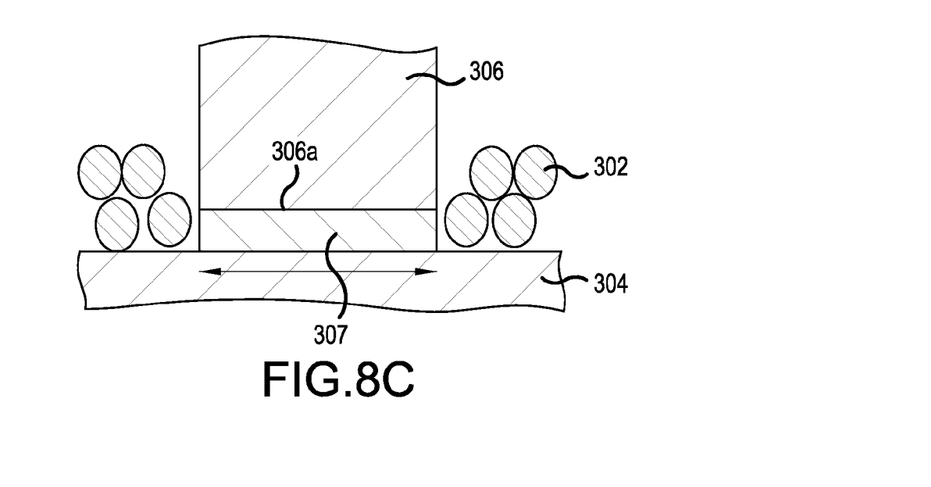

FIGS. 8A to 8C are model diagrams for describing the mechanism of metal particle bonding, in which FIGS. 8A to 8C are diagrams illustrating the steps for realizing metal particle bonding in order.

First, metal nanoparticles 302 are dispersed in a solvent 301 (active solvent) to obtain a paste 303 and the paste 303 is applied to a bonding target member 304 (for example, an upper electrode or the like of a semiconductor chip) (FIG. 8A).

Subsequently, the solvent 301 is heated and evaporated, and a metal nanoparticle layer 305 (a layer in which the metal nanoparticles 302 aggregate in a nanoporus) remains on a bonding target member 304 to be bonded. Pressing force G is applied to the metal nanoparticle layer 305 by a bottom surface 306a of a distal end of the conductive post 306 in a state where the temperature is raised from the prebaking temperature (FIG. 8B). The metal nanoparticle layer 305 is heated and pressed, whereby the metal nanoparticle 302 contacting the metal nanoparticles between the bonding target member 304 and the conductive post 306, the metal nanoparticle 302 contacting the bonding target member 304, and the metal nanoparticle 302 contacting the bottom surface 306a of the distal end of the conductive post 306 are sintered. By this sintering, a strong bonding layer 307 is formed between the bonding target member 304 and the conductive post 306 (FIG. 8C).

In this metal particle bonding, although the pressed metal nanoparticles 302 form the bonding layer 307, the metal nanoparticles 302 which are pushed outside the conductive post 306 and are not pressed do not form the bonding layer 307. Due to this, a fillet like solder bonding is not formed.

Figure 9:
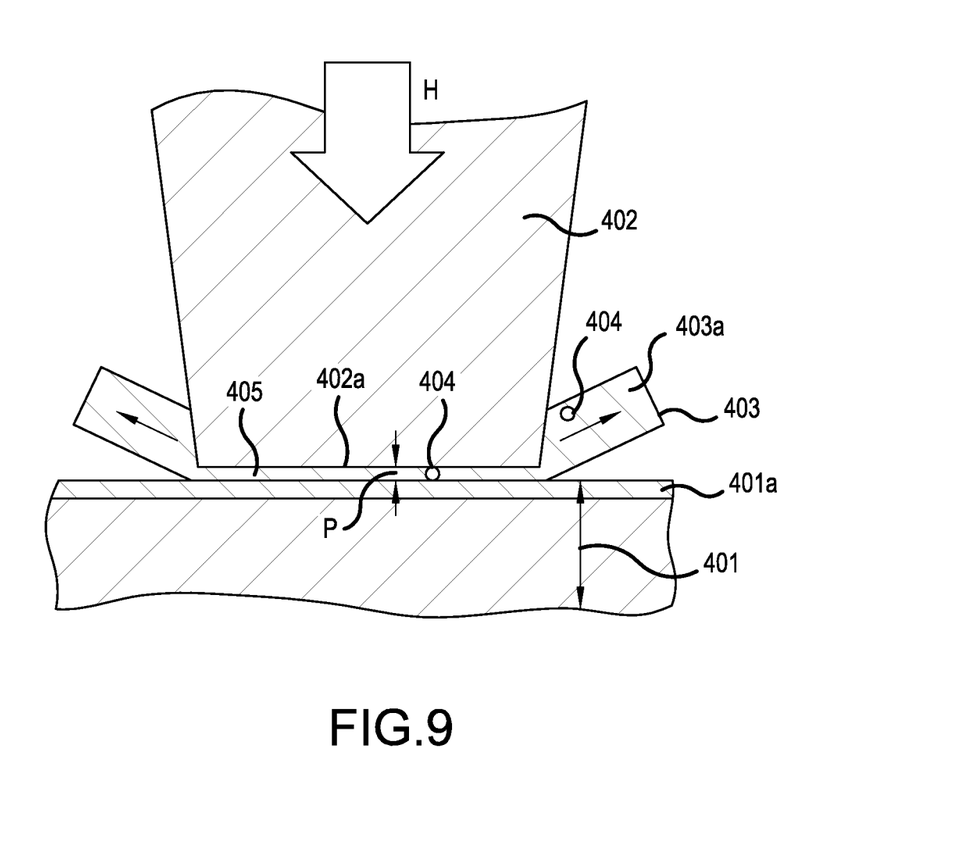
FIG. 9 is a cross-sectional view of a main part when a bottom surface 402a of a distal end of a conductive post 402 is bonded to a upper electrode 401a of a semiconductor chip 401 using metal nanoparticles 404.

FIG. 9 is a cross-sectional view of a main part when a bottom surface 402a of a distal end of a conductive post 402 is bonded to a upper electrode 401a of a semiconductor chip 401 using metal nanoparticles 404.

By the pressing force H applied to a metal nanoparticle layer 403, the metal nanoparticles 404 contacting the flat bottom surface 402a of the conductive post 402 are pushed outside the conductive post 402, and the thickness of the metal nanoparticle layer 403 below the bottom surface 402a of the conductive post 402 becomes as small as several Moreover, the pushed metal nanoparticle layer 403 becomes a non-sintered roll-up layer 403a.

When the thickness P of a bonding layer 405 (the sintered layer of the metal nanoparticle layer 403) below the conductive post 402 decreases to several the roughness of the bottom surface 402a of the conductive post 402 becomes approximately the same as that of the upper electrode 401a, and the pressing force H is not effectively transferred to the metal nanoparticle layer 403. Due to this, a strong bonding layer 405 is not obtained.

FIG. 9 illustrates a case where the bottom surface 402a of the distal end of the conductive post 402 has a flat and tapered shape, it is also difficult to form a strong bonding layer when the conductive post has a straight and flat bottom surface.

Contrary to this reference example, in the semiconductor device described Examples 1 and 2, the concave portion is formed in the bottom surfaces 12 and 23 of the conductive posts 8 and 21 fixed to the semiconductor chip 6, the metal nanoparticles densely filled in the concave portion are heated and pressed to be sintered, whereby the strong bonding layer 7 can be formed as a metal particle bonding layer. Due to this, in a conductive post-connection-type power semiconductor module having a structure without wire bonding, it is possible to improve connection reliability against thermal stress occurring in the bonding portion between the semiconductor chip and the conductive post during operations. Moreover, metal particle bonding realizes a high-temperature operation of semiconductor devices as compared to solder bonding and can be applied to silicon devices and WGB devices.

Moreover, embodiments of the present invention are also effective when the bonding target material is an insulating substrate with conductive patterns (DCB substrate) rather than the semiconductor chip.

The invention claimed is:

1. A semiconductor device comprising:
a semiconductor chip; and
a conductive connector comprising a distal end fixed to a bonding target material, the distal end comprising a concave portion,
wherein the conductive connector is bonded to the bonding target material at the concave portion using metal nanoparticles.

2. The semiconductor device according to claim 1, further comprising a printed circuit board,
wherein the conductive connector is a conductive post or an external leadout terminal fixed to the printed circuit board.

3. The semiconductor device according to claim 2, wherein the conductive connector is the conductive post, and the distal end of the conductive post has a tapered shape, a step shape, or a combination of the step shape and the tapered shape.

4. The semiconductor device according to claim 2, wherein the conductive connector is the conductive post, and the concave portion of the conductive post has a shape that is curved in a spherical shape.

5. The semiconductor device according to claim 1, wherein the bonding target material is a surface electrode of the semiconductor chip or a conductive pattern of an insulating substrate to which the semiconductor chip is fixed.

6. The semiconductor device according to claim 1, wherein a depth of the concave portion is between 10 μm and 200 μm.

7. A semiconductor device comprising:
a conductive connector having a concave portion formed in a distal end thereof;
a sintered metal particle portion; and
a bonding target material,
wherein the conductive connector and the bonding target material are bonded by the sintered metal particle portion disposed between the concave portion and the bonding target material.

8. The semiconductor device according to claim 7, wherein the conductive connector is a rod-shaped conductive post, and
the bonding target material is a surface electrode of a semiconductor chip.

9. The semiconductor device according to claim 7, wherein the conductive connector is a rod-shaped external leadout terminal, and
the bonding target material is a conductive pattern of an insulating substrate.

10. A method for manufacturing a semiconductor device, comprising:
applying a paste containing metal nanoparticles on a bonding target material;
disposing a distal end of a conductive connector on the paste, the distal end comprising a concave portion; and
heating the metal nanoparticles and applying pressure to the metal nanoparticles with the conductive connector to sinter the metal nanoparticles and bond the bonding target material and the concave portion.

11. The method for manufacturing a semiconductor device according to claim 10, wherein
heating the metal nanoparticles comprises heating at a temperature between 150° C. and 300° C., and applying pressure comprises applying the pressure between 10 MPa and 50 MPa.

12. The method for manufacturing a semiconductor device according to claim 10, further comprising:
heating a solvent contained in the paste to evaporate the solvent.

13. The semiconductor device according to claim 2, wherein
the concave portion is configured such that a pressing force applied to the metal nanoparticles converges toward a central axis of the conductive connector.

14. The semiconductor device according to claim 13, wherein
an outer circumferential portion of a bottom surface of the conductive connector is chamfered.

15. The semiconductor device according to claim 4, wherein
the concave portion is configured such that a pressing force applied to the metal nanoparticles converges toward a central axis of the conductive connector.

16. The semiconductor device according to claim 15, wherein
an outer circumferential portion of a bottom surface of the conductive connector is chamfered.

17. The semiconductor device according to claim 7, further comprising a non-sintered metal particle portion disposed around the sintered metal particle portion.

18. The semiconductor device according to claim 1, further comprising a non-sintered metal particle portion,
wherein the metal nanoparticles are sintered metal nanoparticles, and the non-sintered metal particle portion is disposed around the sintered metal nanoparticles.

* * * * *